United States Patent
Ichiyama

(10) Patent No.: US 8,975,756 B2
(45) Date of Patent: Mar. 10, 2015

(54) ELECTRIC TERMINAL DEVICE AND METHOD OF CONNECTING THE SAME

(75) Inventor: Iwane Ichiyama, Ishikawa-ken (JP)

(73) Assignee: Japan Display Central Inc., Fukaya-shi, Saitama (JP)

( * ) Notice: Subject to any disclaimer, the term of this patent is extended or adjusted under 35 U.S.C. 154(b) by 1317 days.

(21) Appl. No.: 11/783,932

(22) Filed: Apr. 13, 2007

(65) Prior Publication Data

US 2007/0246836 A1 Oct. 25, 2007

(30) Foreign Application Priority Data

Apr. 19, 2006 (JP) ................... 2006-115946

(51) Int. Cl.
- H01L 23/48 (2006.01)
- H05K 3/36 (2006.01)
- H05K 1/11 (2006.01)

(52) U.S. Cl.
CPC ............... *H05K 3/361* (2013.01); *H05K 1/117* (2013.01); *H05K 2201/068* (2013.01); *H05K 2201/09781* (2013.01); *H05K 2203/0278* (2013.01); *H05K 2203/166* (2013.01); *H01L 2924/0002* (2013.01)
USPC .......... 257/778; 257/E27.13; 438/30; 349/94; 349/151

(58) Field of Classification Search
USPC .......... 257/778, E27.13; 438/30; 349/94, 151
See application file for complete search history.

(56) References Cited

U.S. PATENT DOCUMENTS

| 6,480,254 B1 * | 11/2002 | Fujita ........................... 349/149 |
| 2002/0008832 A1 * | 1/2002 | Hasegawa et al. ........... 349/151 |
| 2003/0094305 A1 * | 5/2003 | Ueda ............................. 174/254 |
| 2005/0248710 A1 * | 11/2005 | Hirosue et al. ............... 349/151 |

FOREIGN PATENT DOCUMENTS

| JP | 2002-9412 | 1/2002 |
| JP | 2002-32030 | 1/2002 |
| JP | 2003-249527 | 9/2003 |

OTHER PUBLICATIONS

Notification of Reasons for Refusal issued by the Japanese Patent Office on Apr. 9, 2008, for Japanese Patent Application No. 2006-115946 and English-language translation thereof.

* cited by examiner

*Primary Examiner* — Matthew Gordon
(74) *Attorney, Agent, or Firm* — Finnegan, Henderson, Farabow, Garrett & Dunner, L.L.P.

(57) ABSTRACT

An electric terminal device is provided with glass substrate 11, glass-substrate-side electric terminals 15 formed on glass substrate 11, tape carrier packages 16a and 16b which are larger in thermal expansion rate than glass substrate 11, and tape-side electric terminals 21 provided to correspond to glass-substrate-side electric terminals 15. Tape-side electric terminals 21 include alignment terminals 25 to align with terminals at the outer most edges of glass-substrate-side electric terminals 15, and connecting terminals 26 electrically and mechanically connected to glass-substrate-side electric terminals 15 due to thermal expansion of tape carrier packages 16a and 16b by thermo-compression bonding on a condition that alignment terminals 25 of tape-side electric terminals 21 are aligned with the terminals of glass-substrate-side electric terminals 15.

8 Claims, 2 Drawing Sheets

ELECTRIC TERMINAL DEVICE AND METHOD OF CONNECTING THE SAME

CROSS-REFERENCE OF RELATED APPLICATIONS

This application is based upon and claims the benefit of priority from the prior Japanese Patent Application No. 2006-115946, filed on Apr. 19, 2006, the entire contents of which are incorporated herein by reference.

FIELD OF THE INVENTION

This invention generally relates to an electric terminal device provided for connecting terminals formed on a base member to a plurality of electric terminals disposed on a tape substrate that is larger in thermal expansion rate than the base member and a method of connecting the same.

BACKGROUND OF THE INVENTION

Conventionally, a liquid crystal display (LCD) apparatus, as an example of a flat display apparatus, includes a base member, such as a glass substrate, pixels including pixel electrodes and thin-film transistor (TFT) switching elements disposed in a matrix on the substrate to form an LCD panel or an LCD cell, polyimide flexible tape substrates, such as tape-carrier-package (TCP) members, on which driver IC components are assembled to drive the TFT switching elements, and outer lead bonding (OLB) terminals which electrically and mechanically connect TCP members to driver IC components.

A plurality of electric terminals made from indium tin oxide (ITO), for instance, are disposed in parallel with each other on the glass substrate provided for the LCD cell. Also, a plurality of electric terminals made from copper, for instance, are disposed in parallel with each other on the TCP members. Opposed to each other, thermo-compression bonding is carried out for both electric terminals with an anisotropic conductive film set between them. In this way, the electric terminals are electrically and mechanically connected to each other.

The glass substrate of the LCD cell is different in thermal expansion rate from the polyimide tape substrate, so that the tape substrate thermally expands more than the glass substrate when the glass substrate is connected to the polyimide substrate by the thermo-compression bonding. Thus, prior to such connection, disposed pitches of the electric terminals of the tape substrate are set in consideration of the difference in thermal expansion rate, which is called reduced adjustments to make the glass-substrate-side electric terminals equal in pitches to the tape-substrate-side electric terminals after the thermo-expansion bonding (as disclosed in Japanese Patent Publication 2003-249527, for instance).

Since all the electric terminals of the tape substrate, however, are subjected to reduced adjustments, when the electric terminals of the tape substrate are aligned with those of the glass substrate in preparation for connections, operators must determine dispositions of the terminals of the tape substrate in consideration of expansion of the tape substrate while observing connections adjusted between the electric terminals of the tape substrate and those of the glass substrates on a monitor device. In other words, in order for all the electric terminals of the tape substrate to be precisely connected to those of the glass substrate, the electric terminals of the tape substrate must be shifted with respect to those of the glass substrate. Thus, such sophisticated alignment requires experience and time; the problem is that the alignment is not easy.

SUMMARY OF THE INVENTION

Accordingly, it is an object of the present invention to provide an electric terminal device in which electric terminals of a primary substrate are easily connected to those of a tape substrate and a method of connecting the electric terminals.

An aspect of the present invention is directed to an electric terminal device provided with a primary substrate, primary-substrate-side electric terminals formed on the substrate, a tape substrate which is larger in thermal expansion rate than the primary substrate, and tape-side electric terminals provided to correspond to the primary-substrate-side electric terminals. The tape-side electric terminals include an alignment terminal to align with a predetermined one of the primary-substrate-side electric terminals, and a connecting terminal electrically and mechanically connected to the primary-substrate-side electric terminals due to thermal expansion of the tape substrate by thermo-compression bonding on a condition that the alignment terminal of the tape-side electric terminals is aligned with the predetermined one of the primary-substrate-side electric terminals.

Another aspect of the present invention is directed to a method of connecting an electric terminal device provided with a primary substrate, primary-substrate-side electric terminals formed on the substrate, a tape substrate which is larger in thermal expansion rate than the primary substrate, and tape-side electric terminals provided to correspond to the primary-substrate-side electric terminals. Such a method of connecting the electric terminal device carries out aligning an alignment terminal of the tape-side electric terminals with one of the primary-substrate-side electric terminals, and thermo-compression bonding to electrically and mechanically connect a connecting terminal of the tape-side electric terminals to the primary-substrate-side electric terminals due to thermal expansion of the tape substrate.

According to the present invention, since a part of the tape-side electric terminals is used for a terminal or terminals to align with a part of the primary-substrate-side electric terminals, the tape-side electric terminals are easily and surely connected.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DETAILED DESCRIPTION OF THE INVENTION

Figure 1A:
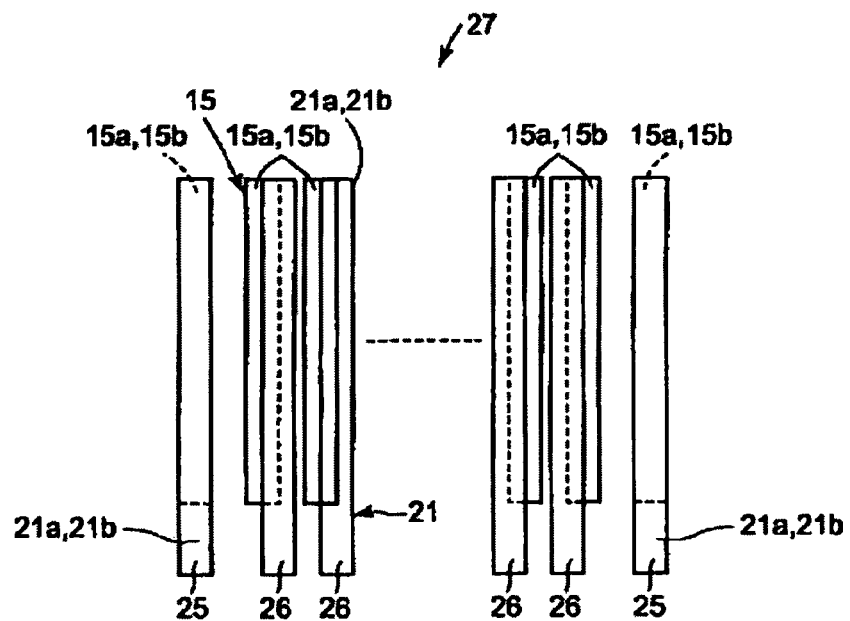
FIG. 1A is a plan view of an electric terminal device prior to connections in accordance with an embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components. The drawings, however, are shown schematically for the purpose of explanation so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other.

EMBODIMENT

An embodiment of the present invention will be described below with reference to FIGS. 1 and 2.

Figure 2:
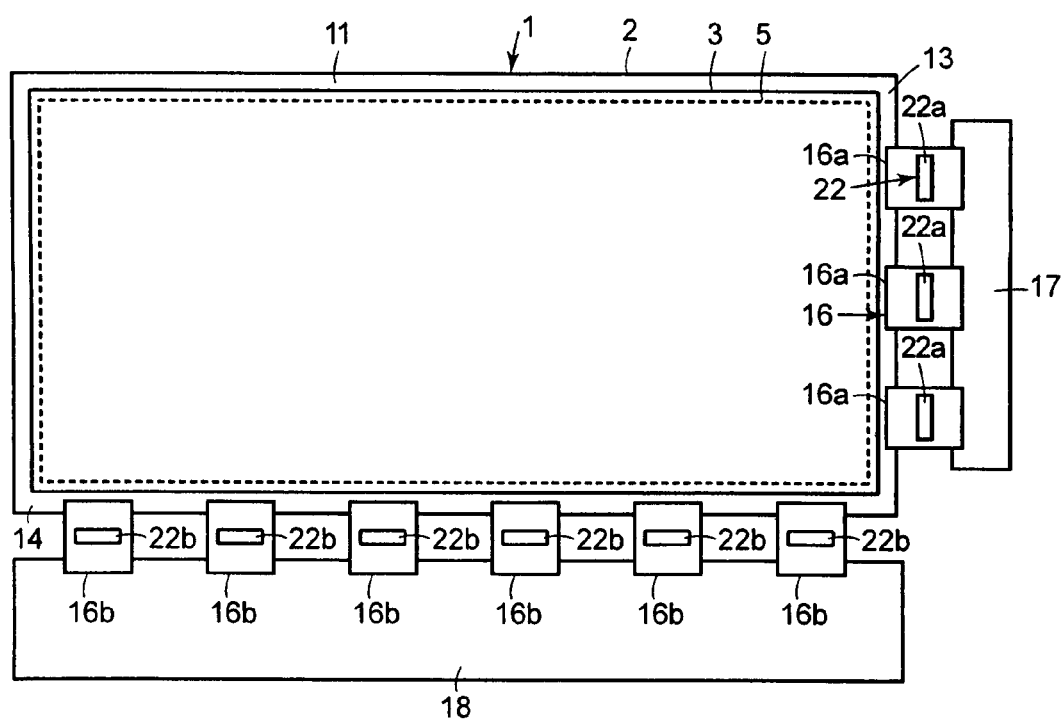
FIG. 2 is a schematic plan view of a flat display apparatus.

FIG. 2 is a partial plan view of an LCD apparatus. The LCD apparatus includes an active matrix type LCD cell 1 provided with pixel array substrate 2 as a first substrate, counter substrate 3 as a second substrate, and a liquid crystal (LC) layer, not shown. Sealants set along circumferences of LCD cell 1 fix counter substrate 3 on pixel array substrate 2, so that the LC layer is held between array substrate 2 and counter substrate 3. A central area of LCD cell 1 is provided with rectangular effective display portion 5 capable of displaying images. Pixels, not shown, are disposed longitudinally and laterally to form a matrix structure on LCD cell 1.

Pixel array substrate 2 is provided with glass substrate 11 as a transparent insulating substrate. Signal and scanning lines, not shown, are disposed to cross each other at right angle on a surface of pixel array substrate 2. Each pixel is provided in a section partitioned and surrounded by the signal and scanning lines. Further, each pixel is further provided with a TFT device as a switching element and a pixel electrode. The pixel electrode is connected to the TFT device in the pixel to control the pixel electrode.

Two side-edge portions of glass substrate 11 extend from effective display portion of LCD cell 1 for their narrow rectangular edge portions to define connecting portions 13 and 14. Leading wires are drawn from effective display portion 5 through connecting portions 13 and 14. Glass-substrate-side electric terminals 15a and 15b shown in FIGS. 1A and 1B (hereinafter called glass-substrate-side electric terminals 15 for either one of those 15a and 15b or both as a whole, as the case may be) are disposed in parallel with each other on connecting portions 13 and 14. Glass-substrate-side electric terminals 15 are electrically and mechanically connected to printed circuit board (PCB) 17 as a gate substrate and PCB 18 as a source substrate through tape carrier package (TCP) members 16a and 16b, respectively.

Figure 1B:
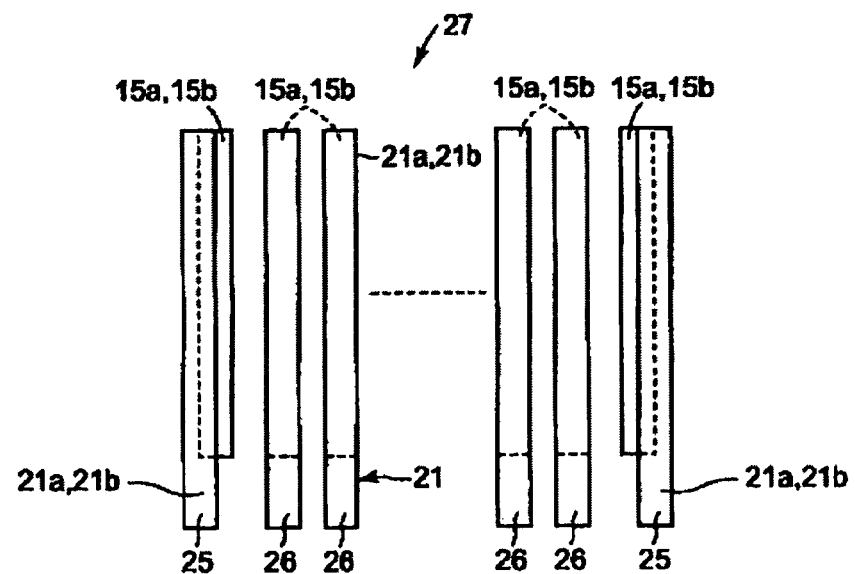
FIG. 1B is a plan view of the electric terminal device with the connections completed.

Glass-substrate-side electric terminals 15 shown in FIGS. 1A and 1B are OLB terminals made from electrically conductive materials such as ITO. Glass-substrate-side electric terminals 15 of glass substrate 11 are disposed in substantially equal pitches to each other which are narrow and rang from 58 µm to 80 µm, for instance.

TCP members 16a shown in FIG. 2 are made from a flexible resin, such as a polyimide tape, which is larger in thermal expansion rate than glass substrate 11 and is quadrilateral in shape. As shown in FIG. 2, TCP members 16a are vertically disposed in substantially equal distances. Each TCP member 16a is a so-called chip-on-flexible (COF) printed-circuit-board (PCB) member implemented with a plurality of tape-side electric terminals 21a disposed in parallel and connected to glass substrate 11 and gate drivers 22a as gate driving IC devices electrically connected to gate electrodes of TFT devices in LCD cell 1.

TCP members 16b shown in FIG. 2 are made from a flexible resin, such as a polyimide tape, which is larger in thermal expansion rate than glass substrate 11 and is quadrilateral in shape. As shown in FIGS. 1A and 1B, TCP members 16b are horizontally disposed in substantially equal distances. Each TCP member 16b is a COF PCB member implemented with a plurality of parallel electric tape-side electric terminals 21b and source drivers 22b as source driving IC devices electrically connected to source electrodes of TFT devices in LCD cell 1.

As the case may be, for convenience, each TCP member 16a or 16b is or TCP members as a whole are called TCP member(s) 16 while each tape-side electric terminal 21a or 21b is or tape-side electric terminals as a whole are called tape-side electric terminal(s) 21. Likewise, each driver 22a or 22b is or drivers as a whole are called driver(s) 22.

Tape-side electric terminals 21 are the OLB terminals made from electrically conductive materials, such as copper, and have a pair of alignment terminals 25 at the outer most edges of tape-side electric terminals 21 and connecting terminals 26 provided between alignment terminals 25.

Alignment terminals 25 are provided at both outer edges of connecting terminals 26, i.e., at the outer most edges of tape-side electric terminals 21. Alignment terminals 25 are exclusively used for alignment with the outer most ones of glass-substrate-side electric terminals 15. Thus alignment terminals 25 are dummy ones, which are not electrically connected to drivers 22 or the like. Glass-substrate-side electric terminals 15 at the outer most edges are also dummy ones, which are not electrically connected to effective display portion 5 (FIG. 2) or the like.

Connecting terminals 26 are disposed in substantially equal distances to each other. Other connecting terminals 26 than those at the outer most edges are thermally and electrically connected to other glass-substrate-side electric terminals 15 than those at the outer most edges by thermo-expansion bonding with an anisotropic conductive film (ACF). That is, such other connecting terminals 26 are electrically connected to their counterpart electric terminals 15 by such thermo-compression bonding. Here, reduction adjustments are taken for the thermal expansion of materials of TCP members 16. Thus, the pitch defined between neighboring connecting terminals 26 is shorter than that of glass-substrate-side electric terminals 15 prior to connecting with each other as shown in FIG. 1A but the former is substantially equal to the latter after connecting each other due to the thermal expansion of TCP members 16 as shown in FIG. 1B. However, such reduction adjustments are not made for alignment terminals 25, so that the pitch defined between alignment terminal 25 and its neighboring connecting terminal 26 is larger than the one defined between neighboring connecting terminals 26.

In summary, electric terminal device 27 is provided with glass substrate 11, glass-substrate-side electric terminals 15, TCP members 16 and tape-side electric terminals 21.

Returning to FIG. 2, gate PCB 17 includes various circuits electrically connected to gate drivers 22a through TCP members 16a to drive gate drivers 22a. Likewise, source PCB 17 also includes various circuits electrically connected to source drivers 22b through TCP members 16b to drive gate drivers 22b.

Next, an explanation will be set forth for a method of connecting the electric terminal device described above as an embodiment of the present invention.

An ACF, not shown, is set between edge portions of TCP members 16 implemented with drivers 22 and connecting portions 13 and 14 of LCD cell 1 in which TFT devices and the like are formed.

At this time an operator aligns glass-substrate-side electric terminals 15 at the outer most edges as reference marks with alignment terminals 25 as shown in FIG. 1A while observing a magnified image of connecting portions 13 and 14 and their adjacent portions on a monitor implemented with a microscope, not shown.

With such an alignment, TCP members 16 are bonded to glass substrate 11 under thermo-compression. Due to thermal expansion of TCP members 16 in right and left directions, alignment terminals 25 are shifted outwardly from glass-substrate-side electric terminals 15 but connecting terminals 26 are overlapped with glass-substrate-side electric terminals 15, so that connecting terminals 26 are electrically connected to glass-substrate-side electric terminals 15 as shown in FIG. 1B.

As described above, the embodiment is directed to the electric terminal device provided with alignment terminals 25 of tape-side electric terminals 21 and connecting terminals 26. Tape-side electric terminals 21 formed in parallel with each other on TCP members 16, which is larger in thermal expansion rate than glass substrate 11. Alignment terminals 25 are provided at the outer most edges of tape-side electric terminals 21 so that alignment terminals 25 can be aligned with glass-substrate-side electric terminals 15 at the outer most edges. With alignment terminals 25 placed in alignment with glass-substrate-side electric terminals 15, the thermo-compression bonding is carried out for them with the ACF. Thus, the other glass-substrate-side electric terminals 15 are electrically and mechanically connected to connecting terminals 26 due to thermal expansion of TCP members 16. Tape-side electric terminals 21 are used in part for alignment terminals 25. Displacement of tape-side electric terminals 21 caused by such thermal expansion of TCP members 16 can be easily and precisely adjusted to connect glass-substrate terminals 15 to connecting terminals 26 without relying on operators' experience and/or intuition.

LCD cell 1 or the like is particularly provided with glass-substrate-side electric terminals 15, the adjacent pitches of which are set extremely fine. Thus, if connecting terminals 26 are not in alignment with glass-substrate terminals 15, usually short circuits are caused or desired circuits are not formed. According to the embodiment, however, glass-substrate-side electric terminals 15 can be easily and precisely aligned with tape-side electric terminals 21 to securely, electrically and mechanically connect connecting terminals 26 to glass-substrate-side electric terminals 15, so that the implementing yield rate and reliability are significantly improved.

Further, although alignment terminals 25 are shifted in place from glass-substrate-side electric terminals 15 at the outer most edges after the completion of connection, such shift does not cause any electric misconnection because alignment terminals 25 and glass-substrate-side electric terminals 15 at the outer most edges are made of dummy terminals.

In addition, since alignment terminals 25 are provided at both ends of connecting terminals 26, i.e., at the outer most edges of tape-side electric terminals, tape-side electric terminals 21 is confirmed with the alignment terminals in the width direction to easily and precisely align connecting terminals 26 with glass-substrate-side electric terminals 15 when connected. Alignment terminals 25 are then outwardly shifted from glass-substrate-side electric terminals when TCP members 16 are extended due to thermal expansion. Thus, no alignment terminals 25 are in contact with the other glass-substrate-side electric terminals 15.

Although the structure of the embodiment is used to electrically and mechanically connect glass-substrate-side electric terminals 11 to TCP members 16, the same is also applicable to electrically and mechanically connect PCB 17 and PCB 18 to TCP members 16 in the case that PCB 17 and PCB 18 are used as base members.

Alignment terminals 25 are not only a pair of terminals but also a single terminal, three terminals or more, as the case may be, to achieve the same functions and effects as the embodiment described above. Alignment terminals 25 are not always provided at the outer most edges of tape-side electric terminals 21 but can be provided any place where no alignment terminals 25 may contact glass-substrate-side electric terminals 15 as a result of the thermal expansion of TCP members 16.

Further, the tape substrate may be other than TCP members, such as flexible printed circuit (FPC) members or COF PCB members.

The embodiment is applied to the electric terminal device used for the LCD apparatus by way of example. The present invention can be also used for any electric terminal devices provided with fine pitched electric terminals.

The present invention is not limited to the embodiment described above but is applicable to various other embodiments without departing from its technical concept.

In the foregoing description, certain terms have been used for brevity, clearness and understanding, but no unnecessary limitations are to be implied therefrom beyond the requirements of the prior art, because such words are used for descriptive purposes herein and are intended to be broadly construed. Moreover, the embodiments of the improved construction illustrated and described herein are by way of example, and the scope of the invention is not limited to the exact details of construction. Having now described the invention, the construction, the operation and use of embodiments thereof, and the advantageous new and useful results obtained thereby, the new and useful construction, and reasonable equivalents thereof obvious to those skilled in the art, are set forth in the appended claims.

What is claimed is:

1. An electric terminal device comprising:
a primary substrate;
a set of primary-substrate-side terminals provided on the primary substrate and having a first pitch between adjacent primary-substrate-side terminals;
a tape substrate which is larger in thermal expansion rate than the primary substrate; and
a set of tape-substrate-side terminals provided in parallel, a number of the tape-substrate-side terminals corresponding to a number of the primary-substrate-side terminals, the tape-substrate-side terminals comprising:
alignment terminals arranged at both ends of the set of the tape-substrate-side terminals to correspond to predetermined primary-substrate-side terminals, and
connecting terminals positioned between the alignment terminals, the connecting terminals being electrically and mechanically connected to the primary-substrate-side terminals by thermo-compression bonding and having a second pitch between adjacent connecting terminals, and a spacing between one of the connecting terminals and one of the alignment terminals immediately adjacent to the one connecting terminal being larger than the second pitch, wherein a reduction adjustment is taken for the second pitch between adjacent connecting terminals but not taken for the spacing.

2. An electric terminal device of claim 1, wherein the tape-substrate-side terminals further comprise alignment terminals located at a position other than the ends of the set of the tape-substrate-side terminals.

3. An electric terminal device of claim 1, wherein the alignment terminals and the predetermined primary-substrate-side terminals comprise dummy terminals.

4. An electric terminal device of claim 1, wherein the primary substrate is a printed circuit board.

5. An electric terminal device of claim 1, wherein the tape substrate is a tape carrier package member.

6. An electric terminal device of claim 1, wherein the tape substrate is a flexible printed circuit board.

7. An electric terminal device of claim 1, wherein the tape substrate is a chip-on-flexible printed circuit board.

8. An electric terminal device of claim 1, further comprising an anisotropic conductive film set between the tape-substrate-side terminals and primary-substrate-side terminals for the thermo-compression bonding.

* * * * *